(12) United States Patent
Rapoport et al.

(10) Patent No.: US 10,490,464 B2
(45) Date of Patent: Nov. 26, 2019

(54) METHODS FOR ASSESSING SEMICONDUCTOR STRUCTURES

(71) Applicant: SunEdison Semiconductor Limited (UEN201334164H), Singapore (SG)

(72) Inventors: Igor Rapoport, Eugene, OR (US); Srikanth Kommu, St. Charles, MO (US); Igor Peidous, Eaton, OH (US); Gang Wang, Grover, MO (US); Jeffrey L. Libbert, O'Fallon, MO (US)

(73) Assignee: GLOBALWAFERS CO., LTD. (TW)

( * ) Notice: Subject to any disclaimer, the term of this patent is extended or adjusted under 35 U.S.C. 154(b) by 0 days.

(21) Appl. No.: 15/893,055

(22) Filed: Feb. 9, 2018

(65) Prior Publication Data

US 2018/0233420 A1 Aug. 16, 2018

Related U.S. Application Data

(60) Provisional application No. 62/457,699, filed on Feb. 10, 2017.

(51) Int. Cl.
*H01L 21/66* (2006.01)
*H01L 23/66* (2006.01)
*G01R 31/26* (2014.01)
*H01L 27/12* (2006.01)

(52) U.S. Cl.
CPC .......... *H01L 22/14* (2013.01); *G01R 31/2648* (2013.01); *H01L 22/20* (2013.01); *H01L 23/66* (2013.01); *H01L 27/12* (2013.01)

(58) Field of Classification Search
CPC ............ G01R 31/2648; G01R 31/2656; G01R 31/2831; G01R 31/311; H01L 22/14; H01L 22/20; H01L 22/10; H01L 23/66; H01L 23/40; H01L 23/291; H01L 23/485; H01L 27/12; H01L 27/00; H01L 27/16643; H01L 27/108; H01L 27/1464; H01L 27/14862

See application file for complete search history.

(56) References Cited

U.S. PATENT DOCUMENTS

| 4,755,865 | A | 7/1988 | Wilson et al. |
| 5,189,500 | A | 2/1993 | Kusunoki |
| 5,436,175 | A | 7/1995 | Nakato et al. |
| 6,043,138 | A | 3/2000 | Ibok |
| 6,373,113 | B1 | 4/2002 | Gardner et al. |

(Continued)

FOREIGN PATENT DOCUMENTS

EP 0939430 A2 9/1999

OTHER PUBLICATIONS

Juarez-Perez et al., "Photoinduced Giant Dielectric Constant in Lead Halide Perovskite Solar Cells", 2014, The Journal of Physical Chemistry Letters, 5, pp. 2390-2394, published Jun. 23, 2014.*

(Continued)

*Primary Examiner* — Nikolay K Yushin
(74) *Attorney, Agent, or Firm* — Armstrong Teasdale LLP

(57) ABSTRACT

Methods for assessing the quality of a semiconductor structure having a charge trapping layer to, for example, determine if the structure is suitable for use as a radiofrequency device are disclosed. Embodiments of the assessing method may involve measuring an electrostatic parameter at an initial state and at an excited state in which charge carriers are generated.

20 Claims, 12 Drawing Sheets

(56) References Cited

U.S. PATENT DOCUMENTS

| | | |
|---|---|---|
| 6,790,747 B2 | 9/2004 | Henley et al. |
| 7,868,419 B1 | 1/2011 | Kerr et al. |
| 7,915,706 B1 | 3/2011 | Kerr et al. |
| 8,076,750 B1 | 12/2011 | Kerr et al. |
| 8,466,036 B2 | 6/2013 | Brindle et al. |
| 8,481,405 B2 | 7/2013 | Arriagada et al. |
| 2012/0161310 A1 | 6/2012 | Brindle et al. |
| 2013/0175599 A1 | 7/2013 | Yang et al. |
| 2015/0145105 A1 | 5/2015 | Haaplinna |

OTHER PUBLICATIONS

Lederer, D., et al., "New Substrate Passivation Method Dedicated to HR SOI Wafer Fabrication With Increased Substrate Resistivity", IEEE Electron Device Letters, vol. 26, No. 11 (Nov. 2005), pp. 805-807.

Lederer, D., et al., "Enhanced High resistivity SOI wafers for RF applications", 2004 IEEE International SOI Conference (Oct. 2004), pp. 46-47.

Gamble, H. S., et al., "Low-Loss CPW Lines on Surface Stabilized High-Resistivity Silicon", IEEE Microwave and Guided Wave Letters, vol. 9, No. 10 (Oct. 1999), pp. 395-397.

Kerr, D. C., et al., "Identification of RF harmonic distortion on Si substrates and its reduction using a trap-rich layer", Silicon Monolithic Integrated Circuits in RF Systems (2008), pp. 151-154.

Ali, K. B., et al., "Efficient polysilicon passivation layer for cross-talk reduction in high-resistivity SOI substrates," 2010 Topical Meeting on Silicon Monolithic Integrated Circuits in RF Systems (SIRF) (Jan. 11, 2010), pp. 212-215.

Aceves, M., et al., "Modeling the Al/Si rich oxide (SRO)/Si structure," Journal of Vacuum Science and Technology, vol. 20, No. 5 (Sep. 2002), pp. 1808-1814.

"SEMI MF391-0708: Test methods for minority carrier diffusion length in extrinsic semiconductors by measurement of steady-state surface photovoltage" (2008), 16 pgs.

Didier, C. et al., "White Paper: RF-SOI Wafer Characterization," Soitec (Jan. 2015), 10 pages.

Lederer, D. et al., "Performance of SOI devices transferred onto passivated HR SOI substrates using a layer transfer technique," 2006 IEEE International SOI Conference Proceedings (2006), pp. 29-30.

* cited by examiner

METHODS FOR ASSESSING SEMICONDUCTOR STRUCTURES

CROSS-REFERENCE TO RELATED APPLICATION

This application claims the benefit of U.S. Provisional Application No. 62/457,699, filed Feb. 10, 2017, which is incorporated herein by reference in its entirety.

FIELD OF THE DISCLOSURE

The field of the disclosure relates to methods for assessing the quality of a semiconductor structure having a charge trapping layer to, for example, determine the charge trap layer efficiency to, for example, determine if the structure is suitable for use in a radiofrequency device. The methods may involve measuring an electrostatic parameter while generating charge carriers by illumination. The electrostatic parameter may be used to determine charge trap layer efficiency.

BACKGROUND

Semiconductor wafers are used in the production of semiconductor devices such as integrated circuit (IC) chips, silicon-on-insulator (SOI) wafers, and radio frequency-SOI (RF-SOI) wafers. Typically, the semiconductor wafers used for RF-SOI include a high resistivity substrate that can be susceptible to formation of a high conductivity inversion or accumulation layer. This inversion or accumulation layer hinders the performance of the semiconductor devices.

In some processes, a layer, such as a polycrystalline silicon layer, is deposited onto a surface of the semiconductor wafer to provide a density charge trap and, thereby, inhibit the formation of the high conductivity inversion or accumulation layer. For example, the layer can be deposited onto a surface that forms the interface between the high resistivity substrate and a buried oxide (BOX) to hinder the movement of charges across the interface.

The effectiveness of charge trapping in semiconductor structures depends on multiple factors including the density of crystal defects, polysilicon structure (grain size), polysilicon deposition [CVD] conditions, status of the polysilicon to silicon substrate interface, doping level, resistivity, interface states, surface contamination and thermal treatment applied during device manufacturing. To ensure a proper charge trapping efficiency, a great variety of technological parameters are carefully controlled and monitored during manufacturing of charge-trapping layer semiconductor wafers for RF device applications. A measurement of charge trapping efficiency is an important component in quality control in charge-trapping layer semiconductor structure manufacturing.

Conventional methods of measuring charge trapping efficiency in semiconductor wafers are based on testing radiofrequency (RF) device performance. RF devices are built on top of the wafers and then tested. The process of RF device manufacturing involves many technological steps and is time consuming. Feedback on the quality of the wafer processing is delayed and this may incur significant throughput and yield losses in wafer manufacturing.

A continuing need exists for methods for assessing the quality of a semiconductor structure such as for use in radiofrequency devices and, in particular, methods that are relatively quick, non-destructive and do not require RF device fabrication.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for assessing the quality of a semiconductor structure. The semiconductor structure has a front surface and a back surface generally parallel to the front surface. The semiconductor structure comprises a charge trapping layer. The structure is illuminated to generate charge carriers in the semiconductor structure. An electrostatic parameter of the structure is measured during or after illumination of the structure to generate charge carriers in the semiconductor structure. The electrostatic parameter is selected from the group consisting of (1) the capacitance of the structure and (2) a difference in voltage potential between the front of the semiconductor structure and an electrode. The quality of the semiconductor structure is assessed based on the measured electrostatic parameter of the structure.

Another aspect of the present disclosure is directed to a method for assessing the quality of a semiconductor structure. The semiconductor structure has a front surface and a back surface generally parallel to the front surface. The semiconductor structure comprises a charge trapping layer. An initial electrostatic parameter of the structure is measured. The electrostatic parameter is selected from the group consisting of (1) the capacitance of the structure and (2) a difference in voltage potential between the front of the semiconductor structure and an electrode. Charge carriers are generated in the semiconductor structure. An excited electrostatic parameter of the structure is measured during or after generation of charge carriers in the structure. The excited electronic parameter is the same as the initial electronic parameter.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 6 illustrates a polysilicon degradation evaluation vs. the anneal thermal budget;

Corresponding reference characters indicate corresponding parts throughout the drawings.

DETAILED DESCRIPTION

Figure 1:
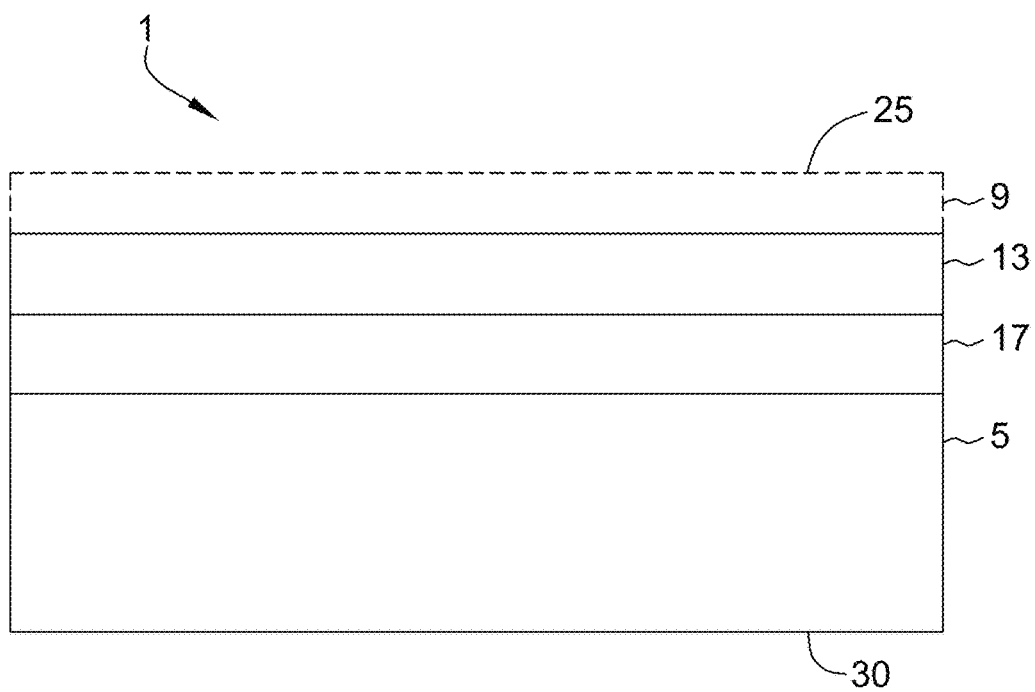
FIG. 1 is a schematic of a silicon-on-insulator (SOI) structure having a charge trapping layer.

Provisions of the present disclosure relate to methods for assessing the quality of a semiconductor structure to, for example, determine the efficiency of a charge trapping layer to determine suitability of the structure for use in radiofrequency devices. Suitable structures which may be assessed include bulk layers having a charge trapping layer and layered structures such as silicon-on-insulator structures having a charge trapping layer. An exemplary structure 1 is shown in FIG. 1 and includes a handle layer 5 (also referred to as handle "wafer" 5), a device layer 9 (typically a silicon device layer) and a dielectric layer or "buried oxide" layer 13 disposed between the device layer 9 and the handle layer 5. A charge trapping layer 17 is disposed between the handle layer 5 and the dielectric layer 13. The structure 1 has a front surface 25 and a back surface 30 generally parallel to the front surface 25 and perpendicular to a central axis of the structure 1.

The charge-trapping silicon-on-insulator structures may be prepared by any of the known methods for preparing such structures. Multi-layered structures and, in particular, silicon-on-insulator structures and methods for producing silicon-on-insulator structures are generally known by those skilled in the art (see, for example, U.S. Pat. Nos. 5,189,500; 5,436,175 and 6,790,747, each of which is incorporated herein by reference for all relevant and consistent purposes). In an exemplary process for making a multi-layered structure, two separate structures are prepared, bonded together along a bond interface, and the donor structure is either etched or delaminated (i.e., cleaved) along a separation plane (i.e., "cleave plane") that is different from the bond interface and which has been formed via an implantation technique. One structure is typically referred to as the "handle" structure and the other is typically referred to as the "donor" structure. After processing, the resulting layered semiconductor structure includes a device layer and a handle layer that supports the device layer.

SOI structures include a further dielectric layer 13 disposed between the handle wafer 5 and device layer 9. The dielectric layer may be formed on the bonding surface of the donor and/or handle structure prior to bonding the donor and handle together. The dielectric layer 13 may be any electrically insulating material suitable for use in a SOI structure, such as a material comprising $SiO_2$, $Si_3N_4$, aluminum oxide, or magnesium oxide. In some embodiments, the dielectric layer 13 is $SiO_2$ (i.e., the dielectric layer consists essentially of $SiO_2$). However, it is to be noted that in some instances, it may alternatively be preferable to use a material for the dielectric layer which has a melting point which is higher than the melting point of pure $SiO_2$ (i.e., higher than about 1700° C.). Examples of such materials are silicon nitride ($Si_3N_4$), aluminum oxide, and magnesium oxide.

The handle wafer may comprise a material selected from the group consisting of silicon, silicon carbide, silicon germanium, gallium arsenide, gallium nitride, indium phosphide, indium gallium arsenide, germanium, and combinations thereof. In some embodiments of the present disclosure, the donor and/or handle wafers used to produce the SOI structure are composed of single crystal silicon and are obtained by slicing the wafers from ingots formed by the Czochralski process. The handle wafer and/or the donor wafer (and resulting SOI structure) may be any diameter suitable for use by those of skill in the art including, for example, 200 mm, 300 mm, greater than 300 mm or even 450 mm diameter wafers.

In general, the handle layer may have any thickness capable of providing sufficient structural integrity to allow delamination of the device layer. In general, the handle layer may have an average thickness of at least about 100 micrometers, typically at least about 200 micrometers and may have a thickness of from about 100 to about 900 micrometers, or even from about 500 to about 800 micrometers. In some embodiments, the dielectric layer, e.g., buried oxide layer, has a thickness of at least about 10 nanometers, such as between about 10 nanometers and about 10,000 nanometers, between about 10 nanometers and about 5,000 nanometers, or between about 100 nanometers and about 800 nanometers. Generally, the device layer is between 0.01 and 20 micrometers thick, such as between 0.05 and 20 micrometers thick.

A charge trapping layer 17 may be formed by depositing a semiconductor material onto the exposed front surface of the single crystal semiconductor handle wafer prior to bonding. The thickness of the charge trapping layer 17 may be between about 0.3 micrometers and about 5 micrometers, such as between about 0.3 micrometers and about 3 micrometers, such as between about 0.3 micrometers and about 2 micrometers or between about 2 micrometers and about 3 micrometers. The handle wafer preferably comprises an exposed oxidized front surface layer prior to deposition. Semiconductor material suitable for use in forming a charge trapping layer in a silicon-on-insulator device is suitably capable of forming a highly defective layer in the fabricated device. Such materials include polycrystalline semiconductor materials and amorphous semiconductor materials any may include polycrystalline or amorphous silicon (Si), silicon germanium (Site), silicon doped with carbon (SiC) and germanium (Ge).

As referenced herein, "polycrystalline" silicon may denote a material comprising small silicon crystals having random crystal orientations. Polycrystalline silicon grains may be as small in size as about 20 nanometers. Generally, the smaller the crystal grain size of polycrystalline silicon the higher the defectivity in the charge trapping layer. Amorphous silicon comprises a non-crystalline allotropic form of silicon, which lacks short range and long range order. Silicon grains having crystallinity over no more than about 10 nanometers may also be considered essentially amorphous. The charge trapping layer may have a resistivity at least about 1000 Ohm-cm or at least about 3000 Ohm-cm, such as between about 1000 Ohm-cm and about 100,000 Ohm-cm or between about 1000 Ohm-cm and about 10,000 Ohm-cm.

The material for deposition onto the, optionally oxidized, front surface of the single crystal semiconductor handle wafer may be deposited by means known in the art. For example, the semiconductor material may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), or molecular beam epitaxy (MBE). Silicon precursors for LPCVD or PECVD include methyl silane, silicon tetrahydride (silane), trisilane, disilane, pentasilane, neopentasilane, tetrasilane, dichlorosilane ($SiH_2Cl_2$), silicon tetrachloride ($SiCl_4$), among others. For example, polycrystalline silicon may be deposited onto the surface oxidation layer by pyrolyzing silane ($SiH_4$) in a temperature range between about 550° C. and about 690° C., such as between about 580° C. and about 650° C. The chamber pressure may range from about 70 to about 400 mTorr.

Amorphous silicon may be deposited by plasma enhanced chemical vapor deposition (PECVD) at temperatures generally ranging between about 75° C. and about 300° C. Silicon germanium, particularly amorphous silicon germanium, may be deposited at temperatures up to about 300° C. by chemical vapor deposition by including organogermanium compounds, such as isobutylgermane, alkylgermanium trichlorides, and dimethylaminogermanium trichloride. Silicon doped with carbon may be deposited by thermal plasma chemical vapor deposition in epitaxial reactors using precursors such as silicon tetrachloride and methane. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane. In some embodiments, the silicon layer may comprise a carbon concentration of at least about 1% on an atomic basis, such as between about 1% and about 10%.

In some embodiments, the semiconductor handle layer 5, such as a single crystal silicon handle wafer, has a relatively high minimum bulk resistivity or includes a region near the charge trapping layer 17 that includes such a high resistivity. High resistivity wafers are generally sliced from single crystal ingots grown by the Czochralski method or float zone method. In some embodiments, the handle layer 5 is doped to have a minimum bulk resistivity of at least 100 Ohm-cm or at least 500 Ohm-cm, at least 1000 Ohm-cm or even at least 10,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.). A high resistivity region in the handle wafer (as opposed to a wafer having high resistivity throughout) may be formed by the methods disclosed in U.S. Pat. No. 8,846,493 which is incorporated herein by reference for all relevant and consistent purposes.

In accordance with embodiments of the present disclosure, a semiconductor structure (e.g., bulk wafer or a silicon-on-insulator structure) having a charge trapping layer is assessed to determine efficiency of the charge trapping layer (e.g., for suitability for use in a radio-frequency (RF) device). The electrostatic parameter is measured while generating charge carriers by illumination.

Generally the charge trapping layer of the structure (bulk wafer or SOI structure) that is assessed is continuous, i.e., the structure does not have device features such as trenches, vias and the like on the surface of the silicon device layer and does not include other features used in conventional assessment methods (e.g., a co-planar waveguide on the surface of the silicon layer or box layer).

Figure 9:
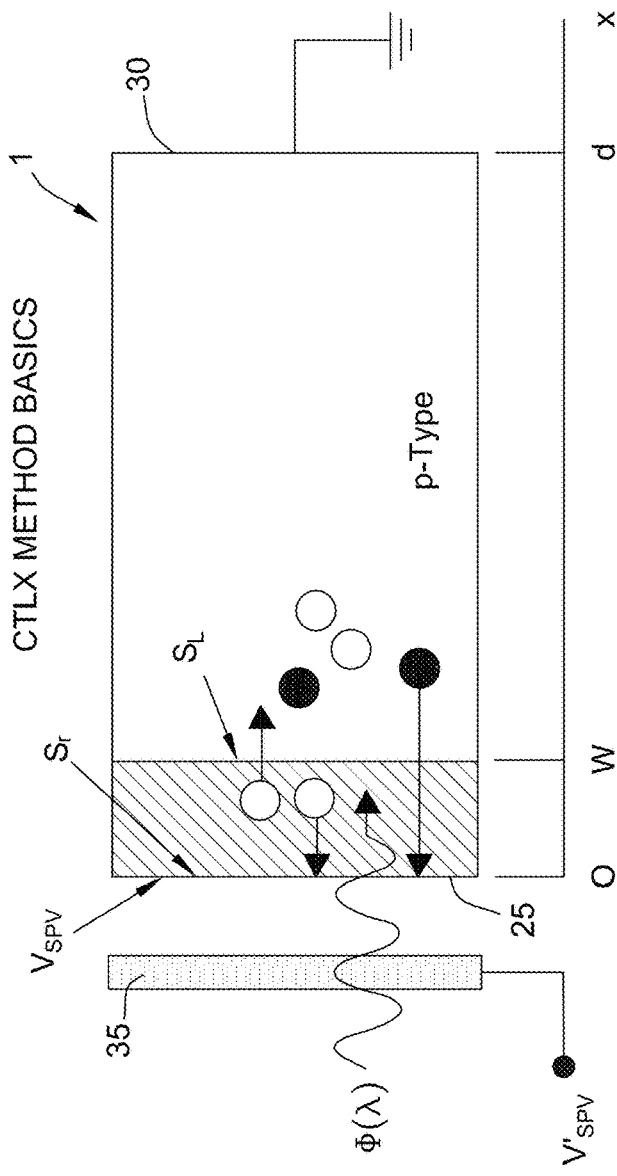
FIG. 9 is a schematic of the SPV characterization method (CTLX)

Suitable electrostatic parameters that may be measured according to embodiments of the present disclosure include (1) the capacitance of the structure and (2) a difference in voltage potential such as the difference in voltage potential between the front surface 25 (FIG. 1) of the semiconductor structure and an electrode 35 (FIG. 9).

Charge carriers may be generated by directing any light that is capable of generating electrons in silicon at the structure. For light at wavelengths shorter than about 1.1 micrometers, the wafer may be illuminated at an intensity of at least about 50 mW/cm$^2$ and, in other embodiments, at least about 100 mW/cm$^2$ or even about 200 mW/cm$^2$. It should be noted that light at wavelengths longer than about 1.1 micrometers may also be used; however in some embodiments the light should be applied at a higher power or for a longer period of time relative to shorter wavelength light (e.g., at least about 500 mW/cm$^2$ or even at least about 1,000 mW/cm$^2$). In one or more embodiments, illumination is provided via lasers or heating lamps located within a belt furnace or a rapid thermal annealing apparatus. It may be preferred to illuminate all surfaces of the structure to influx charge carriers; however in one or more embodiments of the present disclosure only the front surface of the structure is illuminated.

Figure 12:
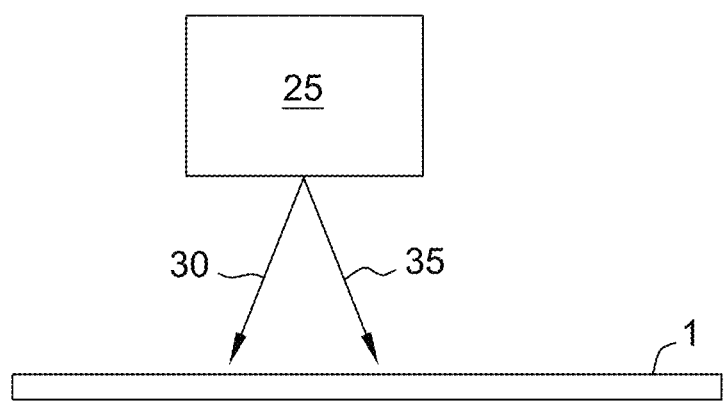
FIG. 12 is a schematic of a laser illuminating a semiconductor structure at two different wavelengths.

In embodiments in which a laser 25 (FIG. 12) is used to illuminate the semiconductor structure to generate charge carriers, more than one laser wavelength may be used. For example, one wavelength 30 may be chosen to extend into the charge trapping layer (e.g., 670 nm+/−300 nm) and a second wavelength 35 chosen to extend into the substrate (1015 nm+/−400 nm). In this regard, in other embodiments 3, 4, 5, 6, 7, 8 or even more wavelengths may be used to, for example, target a particular depth or region of the structure.

In some embodiments, the electrostatic parameter (e.g., voltage or capacitance) is normalized to the electrostatic parameter at a particular trap density (e.g., normalized to a bulk wafer or SOI structure with no trap layer). The normalized difference in the electrostatic parameter may be converted to a "trapping efficiency" (e.g., when normalized to the zero trapping condition of structures not having a trap layer).

In some embodiments, a baseline electrostatic parameter is established in which an acceptable limit (e.g., maximum) in capacitance or voltage potential is determined. The measured difference for each assessed structure is compared to the baseline to determine if the structure is suitable for use (e.g., for use in a radiofrequency device).

The electrostatic parameter may be measured at multiple sites (e.g., a first site, second site, third site, etc.) of the wafer and the parameter averaged to determine suitability of the structure for use in RF devices. Alternatively or in addition, the capacitance or voltage potentials may be used to produce a state map of the structure.

In some embodiments, an initial or "resting" electrostatic parameter of the structure is first measured. An "excited" state of the electrostatic parameter of the structure is subsequently measured while or after generating charge carriers in the structure. The difference between the initial electrostatic parameter and the excited electrostatic parameter is determined and used to determine the suitability of the structure for use in a RF device.

The initial electrostatic parameter is measured while the structure is at a "resting" state, i.e., while not generating charge carriers. The electrostatic state may be measured while not illuminating the structure. Once the initial value of the capacitance or voltage potential is measured, charge carriers are generated in the semiconductor structure. Once charge carriers are generated, the electrostatic parameter measured at the initial, rested state is again measured while generating charge carriers or shortly after. The difference between the initial electrostatic parameter and the excited electrostatic parameter is determined to assess the suitability of the structure for use in a RF device. As illustrated in Examples 1 and 2, a lesser difference in capacitance or voltage potential indicates better charge trapping in the structure (i.e., better suitability for RF devices) and vice versa.

As stated above, characterization of the charger trapping layer (CTL) may be based on the measured voltage signal (i.e., surface photo voltage or SPV). Evaluation may be performed after excitation of the minor carriers caused by a specific wavelength laser. Laser wavelengths may be chosen to penetrate the CTL layer (like 657 nm wavelength, and/or longer wavelength). The same wavelengths may be used for evaluation of the samples over time to make the data comparable. Also, the same light injection levels may be used (related to the assigned laser power) to secure the method repeatability/reproducibility.

SPV signal evaluation may use a conventional SPV tool, implementing at least two wavelength injection (for example 657 nm and 1013 nm). The measured SPV signal is equivalent/proportional to the actual recombination efficiency on the polysilicon-based CTL. Generally, the lower the SPV signal, the higher the CTL recombination efficiency. In the case of polysilicon layer degradation that may be caused by recrystallization and/or metals contamination, the SPV signal is expected to increase indicating the lower CTL layer recombination efficiency (See FIG. 9).

The structure may be mounted on a grounded platform during SPV characterization. As shown in FIG. 9, the SPV tool may include an electrode 35 (e.g., transparent electrode) that is positioned just above the front surface 25 of the structure 1. The difference between the voltage potential between the front surface 25 of the structure and the electrode 35 with respect to ground is then measured.

Figure 10:
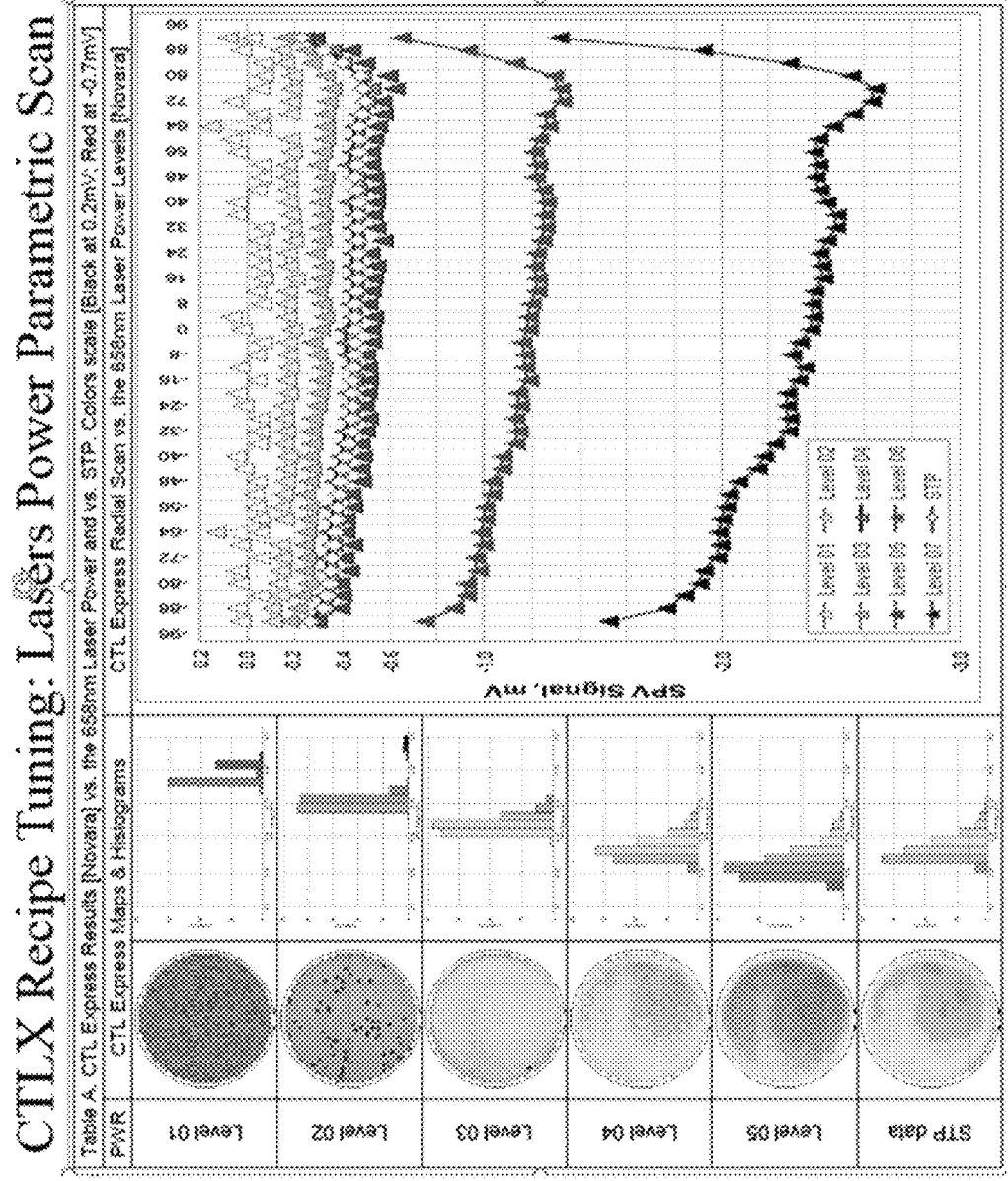
FIG. 10 represents SPV tools correlation based on the SPV lasers power calibration.

SPV tools used for evaluation may be calibrated using pre-measured monitor samples. Tool calibration assists in layer evaluation to use the different tools in the separate production lines. SPV tool calibration may employ the SPV lasers power parametric scan for measuring monitor samples at different injection (light excitation) conditions. Different fixed injection levels per tool may be used to have the same CTL layer SPV signal evaluation results. FIG. 10 represents two SPV tools correlation based on the SPV lasers power calibration.

Figure 11:
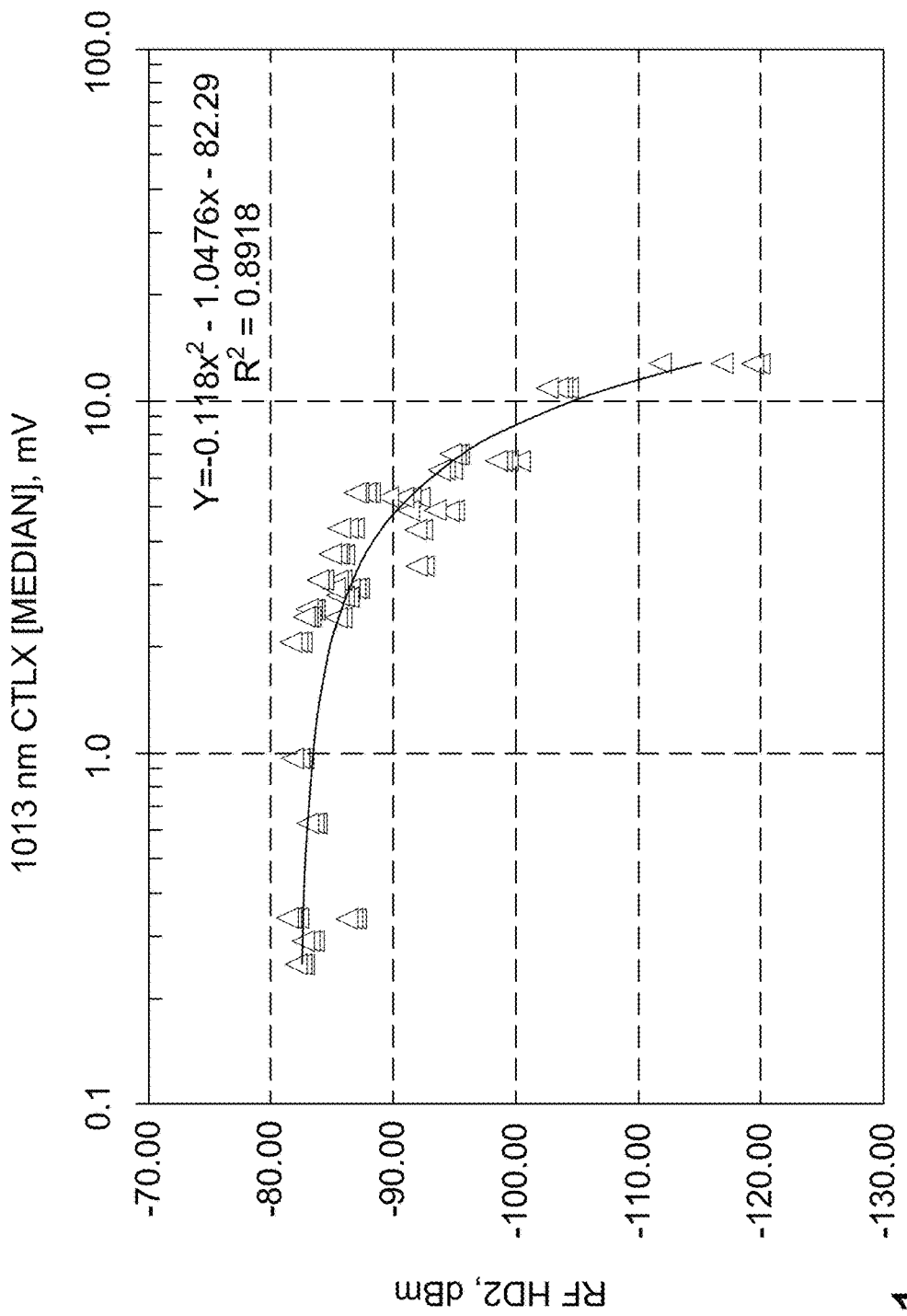
FIG. 11 illustrates the second order harmonics (HD2) vs. measured voltage.

In some embodiments, use of a higher wavelength SPV laser (like 1013 nm, penetrating through the polysilicon layer to the high-resistivity handle wafer bulk) may improve the correlation for the related SPV Signal verse the handle wafer actual resistivity. The handle wafer resistivity [along with the CTL layer recombination efficiency] may significantly impact second order harmonics (HD2) of RF devices (See FIG. 11).

Generally, each structure of a plurality of structures is assessed to determine which structures should be rejected and which are suitable (e.g., for producing radiofrequency devices) by measuring an initial and excited electrostatic parameter of each structure at one or more sites of each structure. The difference in the electrostatic parameter for each structure may be compared to a baseline difference to determine if the semiconductor is acceptable such as for use in a radiofrequency device. In other embodiments, a single structure of a batch of structures may be assessed to determine suitability of the batch for use in RF applications.

After assessing the structure, the structure may be further processed such as, for example, by forming a radiofrequency device on the structure.

Compared to conventional methods for assessing structures such as methods for assessing structures having charge trapping layers for suitability in radiofrequency devices, the methods of the present disclosure have several advantages. Methods for assessing do not involve RF device fabrication or fabrication of additional structures in the device layer or on the surface of the structure. This allows the assessment to be performed relatively fast and without destruction of the assessed structure. The assessment method may be performed at multiple sites on the structure and averaged to account for in-wafer variation in the electrostatic parameter. The assessment method may be performed on each wafer of a batch of wafers for account of wafer-to-wafer variation in the batch.

The electrostatic parameter (e.g., SPV signal) may correlate well versus the polysilicon deposition conditions and versus the post-deposition thermal anneal that could impact the basic CTL layer properties. Obtained results correlate well to the commonly used second order harmonics (HD2) evaluation for RF.

Assessment methods of the present disclosure may generally be high-resolution with fast turnaround, non-destructive, and may be implemented to the samples after any process step to monitor the CTL layer quality. It may be measured at least twice (a) after the polysilicon deposition, and (b) for end-of-line samples after the top-silicon layer is removed.

EXAMPLES

The processes of the present disclosure are further illustrated by the following Examples. These Examples should not be viewed in a limiting sense.

Figure 2:
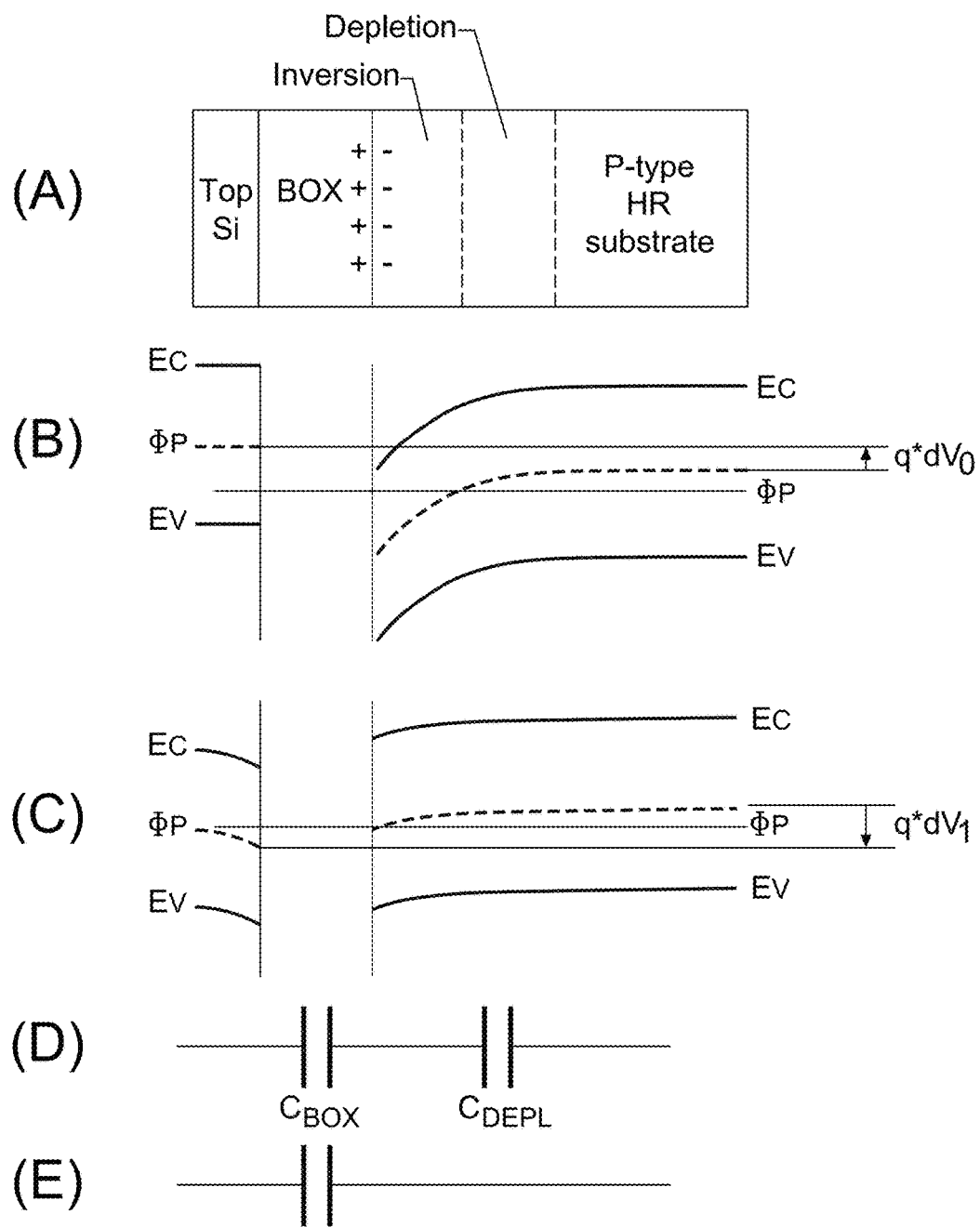
FIG. 2 includes energy band diagrams for a SOI structure without (or with an inefficient) charge trapping layer.

Example 1: Difference in Voltage Potentials and Capacitance in Structures without a Charge Trapping Layer The difference in voltage potential before and during generation of charge carriers for a SOI structure without a charge trapping layer (or an inefficient CTL) is shown in energy band diagrams in FIG. 2. Positive charge in the BOX induces a depletion and inversion layer in the high resistivity substrate (FIG. 2A). The related energy band diagram before charge carrier generation is shown in FIG. 2B. The difference between the front and back-side (grounded) surface potentials is $V_0$. Illumination of the structure with an intense light generates a high density of photo-carriers (holes and electrons) which change the energy bands at the BOX-substrate interface towards a flat-band condition (FIG. 2C). Accordingly, the charges at this interface are redistributed causing a change in the electric field that changes the energy bands in the top silicon. As a result, the difference between the front and back-side surface potentials $V_1$ also changes and may invert the charge. A large difference between $V_1$ and $V_0$ indicates a lack of charge trapping in the SOI structure.

The effective capacitance of the SOI structure is set by the BOX and the depletion layer in the substrate (FIG. 2D). The illumination of the structure with intense light fills up the depletion area with a high density of photo-carriers and overrides the depletion. As a result, the effective SOI wafer capacitance is changed to that primarily controlled by the BOX (FIG. 2E). The significant change of the capacitance indicates the lack of charge trapping in the SOI structure.

Figure 3:
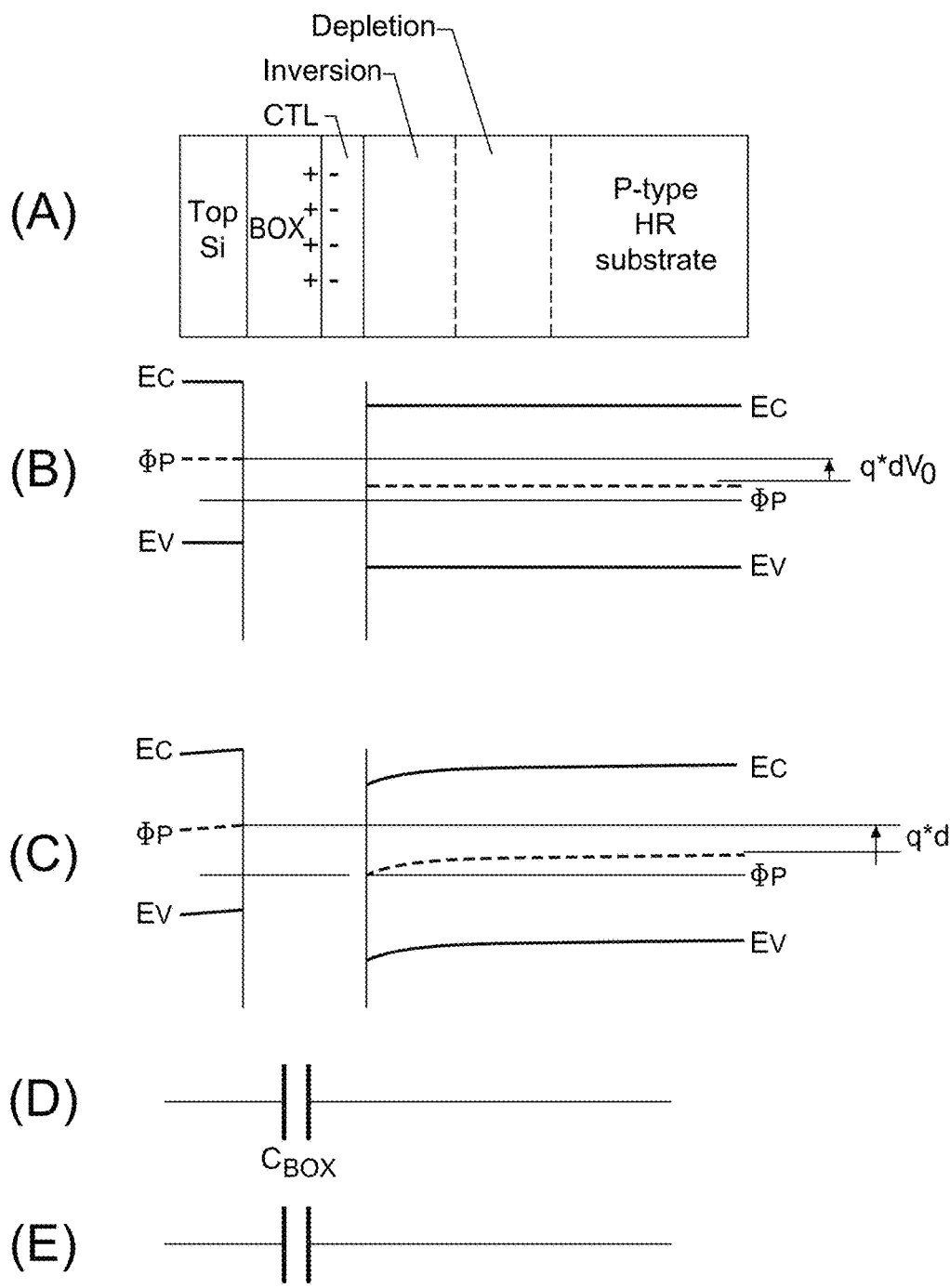
FIG. 3 includes energy band diagrams for a SOI structure with a charge trapping layer.

Example 2: Difference in Voltage Potentials and Capacitance in Structures with a Charge Trapping Layer The difference in voltage potential before and during generation of charge carriers for a SOI structure having an efficient charge trapping layer is shown schematically in energy band diagrams in FIG. 3. Positive charges in the BOX are completely compensated with negatively charged states in the charge trapping layer (CTL) (FIG. 3A). The related energy band diagram without charge generation is shown in FIG. 3B. The energy bands in the substrate are flat. The difference between the front and back-side (grounded) surface potentials is $V_0$. Illumination of the structure with an intense light generates high density of photo-carriers (holes and electrons) which cannot significantly change the energy bands of the high resistivity (lightly doped) semiconductor because its mid-gap energy level is originally close to the Fermi level. Accordingly, the charges at this interface remain almost the same and the energy bands in the top silicon are affected relatively little (FIG. 3C). The difference between the front and backside surface potentials $V_1$ does not change much. Insignificant difference between $V_1$ and $V_0$ indicates the efficient charge trapping in the SOI structure at the BOX-substrate interface.

The effective capacitance of the SOI structure with the efficient charge trapping layer (FIG. 3A) is dominated by the BOX only (FIG. 3D). The illumination of the structure with the intense light fills up the lightly doped substrate with a high density of photo-carriers which do not significantly change the band structure of the semiconductor elements of the SOI. Therefore, the effective wafer capacitance does not change significantly and still relates to the BOX (FIG. 3E). Insignificant change of the capacitance indicates efficient charge trapping in the SOI structure.

Example 3: Assessing the Quality of Bulk Wafers for RF Device Applications

A bulk wafer having a charge trapping layer at its surface was assessed with a surface photovoltage (SPV) tool. The evaluation recipe included (but was not limited to): (a) SPV laser wavelengths of 657 nm and at 1013 nm; (b) SPV lasers power tuning to use the optimal level for the measured sample; (c) photovoltage readings analysis for the 657 nm laser (excitation at the specific laser power tuned per the measured sample type); (d) CTL performance being predicted based on the actual SPV readings correlated to the RF HD2 and HD3 evaluation results; (e) 657 nm laser excitation was selected to keep the penetration depth limited to the polysilicon layer plus the shallow semiconductor wafer layer; (f) penetration depth was selected to avoid the silicon bulk impact (driven rather by the silicon doping level and by the metal contamination level); (g) sample design was P-type high resistivity substrate and CTL polysilicon layer with or without a thermal oxide.

Figure 4:
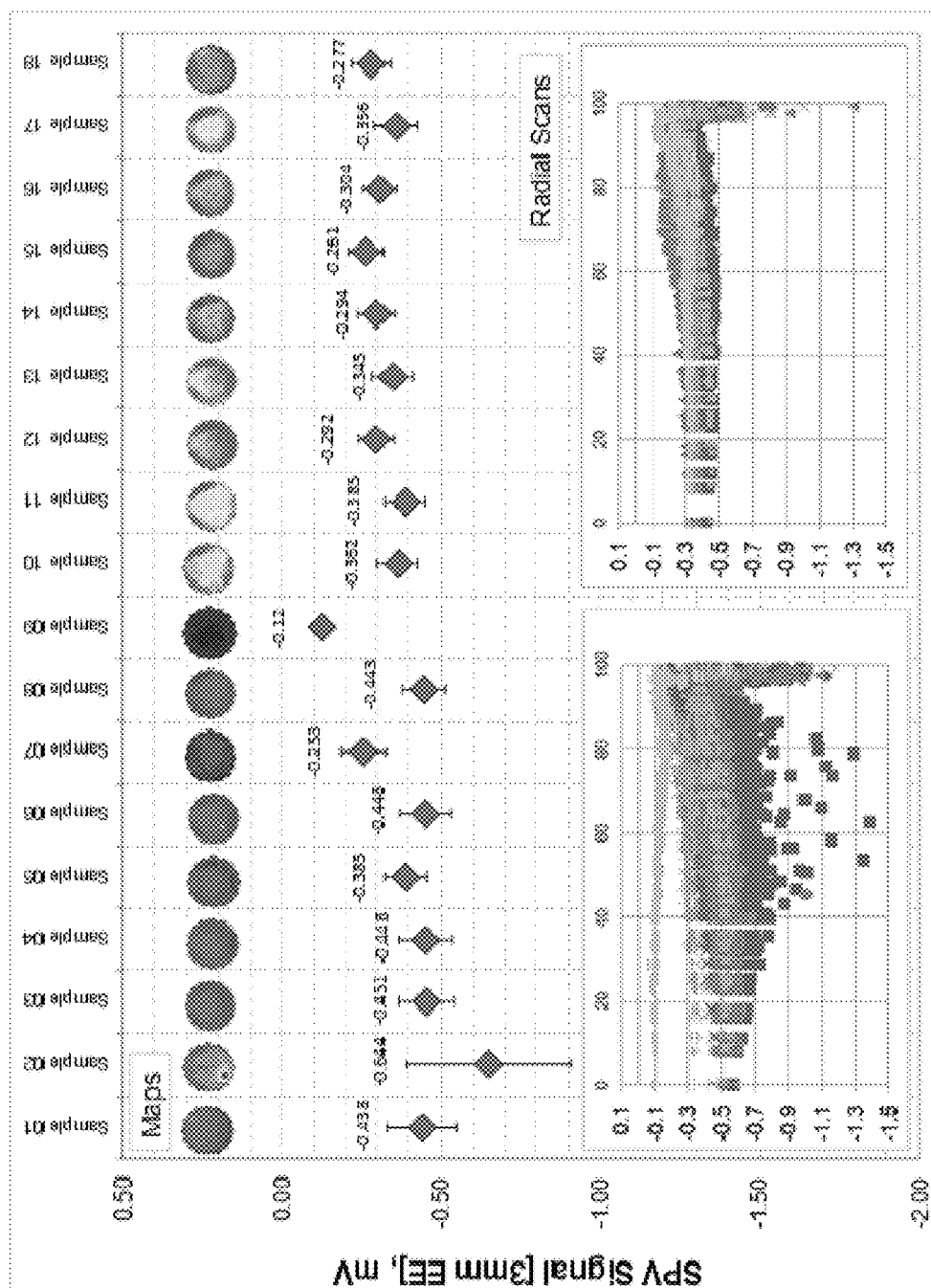
FIG. 4 illustrates evaluation results for bulk wafers having a charge trapping layer of Example 3.

Evaluation results for the sample after the polysilicon deposition are shown in FIG. 4.

Example 4: Assessing the Quality of RF Wafers for Device Applications

Figure 5:
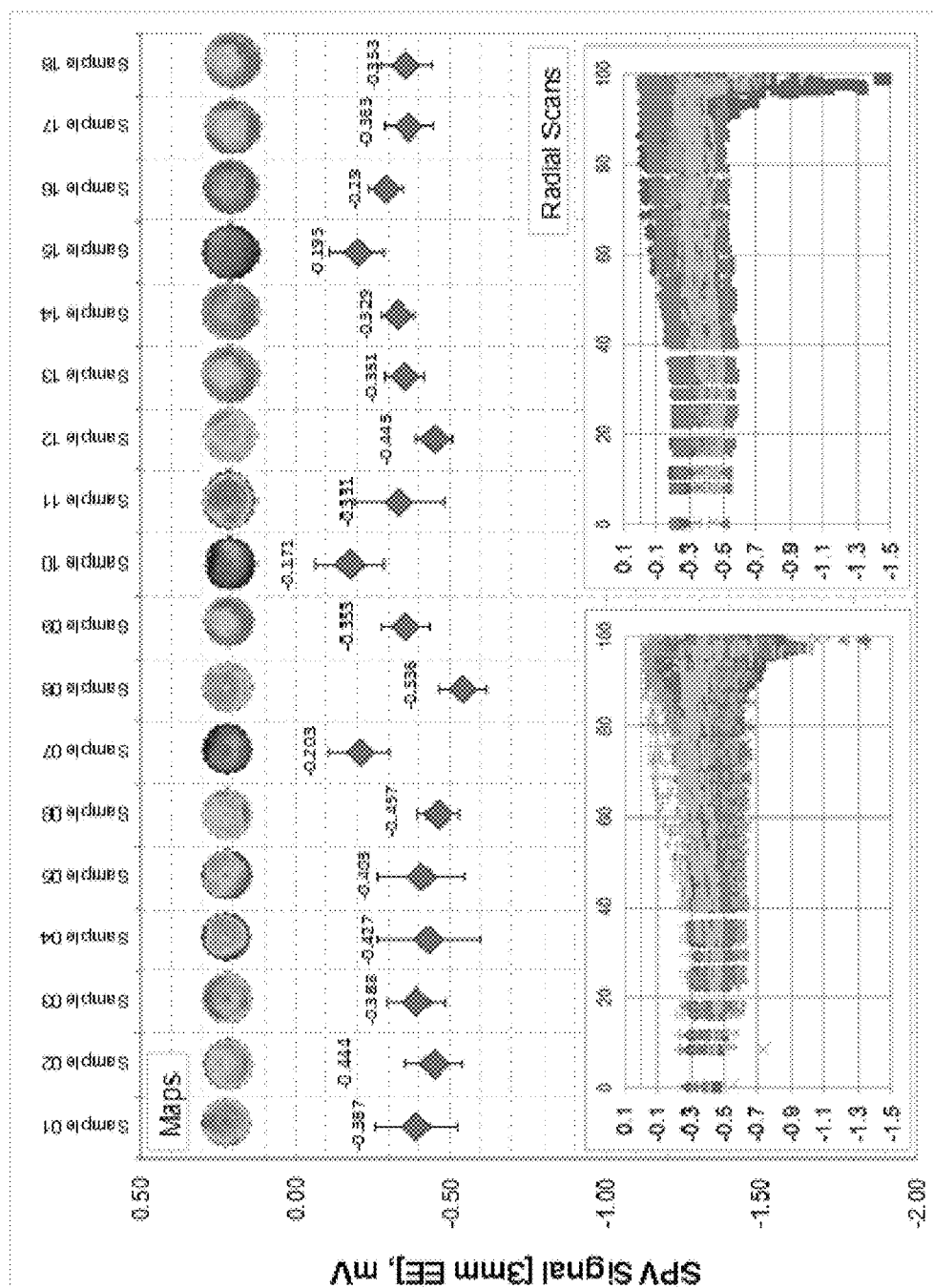
FIG. 5 illustrates evaluation results for SOI structures having a charge trapping layer of Example 4.

A SOI structure having a charge trapping layer was assessed with a surface photovoltage (SPV) tool. The evaluation protocol of Example 3 was used with the sample design being a P-type high resistivity substrate+CTL polysilicon layer+BOX+top-Si layer. Evaluation results for the sample after the polysilicon deposition are shown in FIG. 5.

Examples 5: Further Exemplification of Embodiments of the Present Disclosure in FIGS. 6-8

Figure 6:
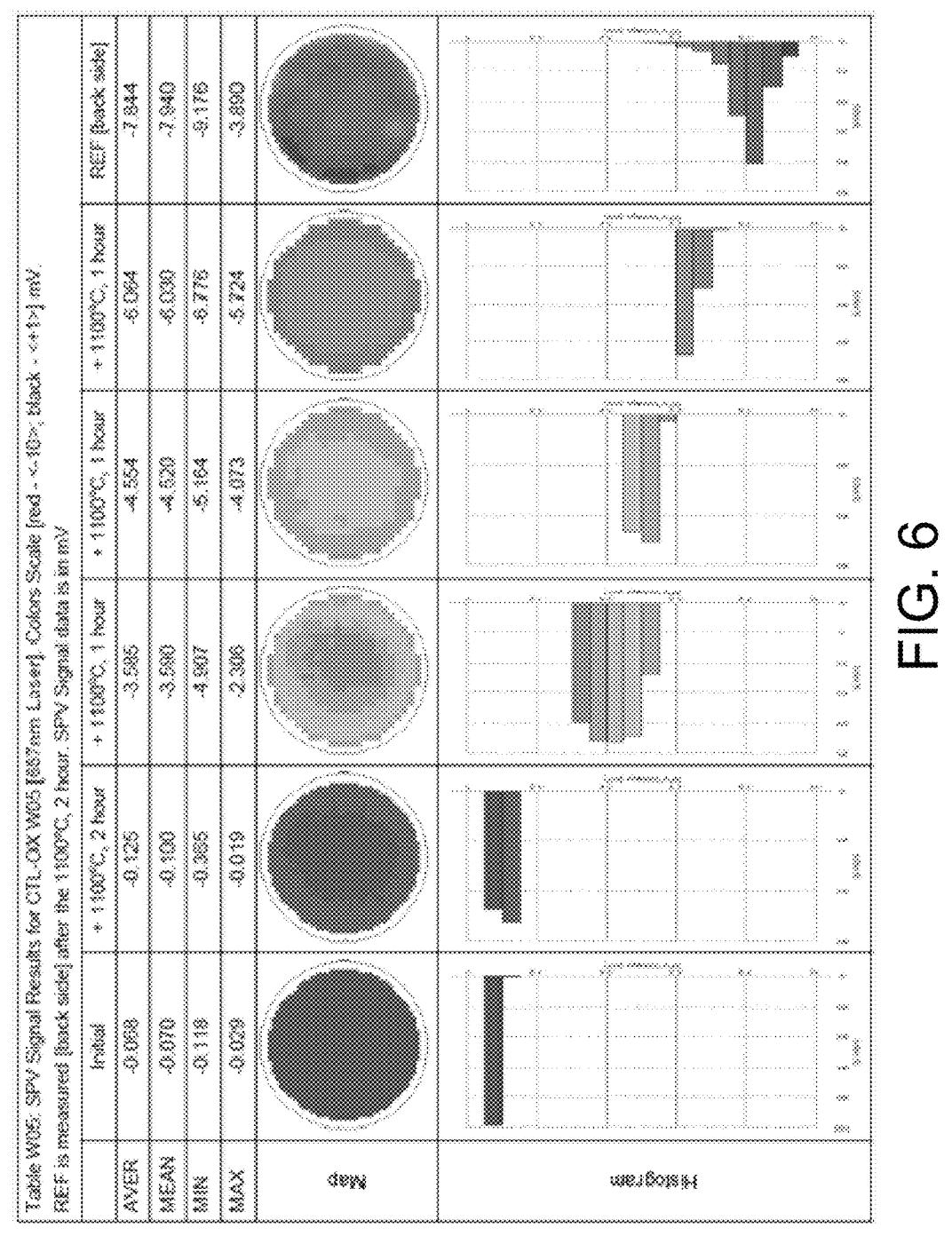

FIG. 6: Polysilicon degradation evaluation vs. the Anneal thermal budget. Implemented (the SPV Signal evaluation technique [657 nm SPV laser excitation]. Degrades completely after the 5-hour cumulative Anneal at 1100° C.

Figure 7:
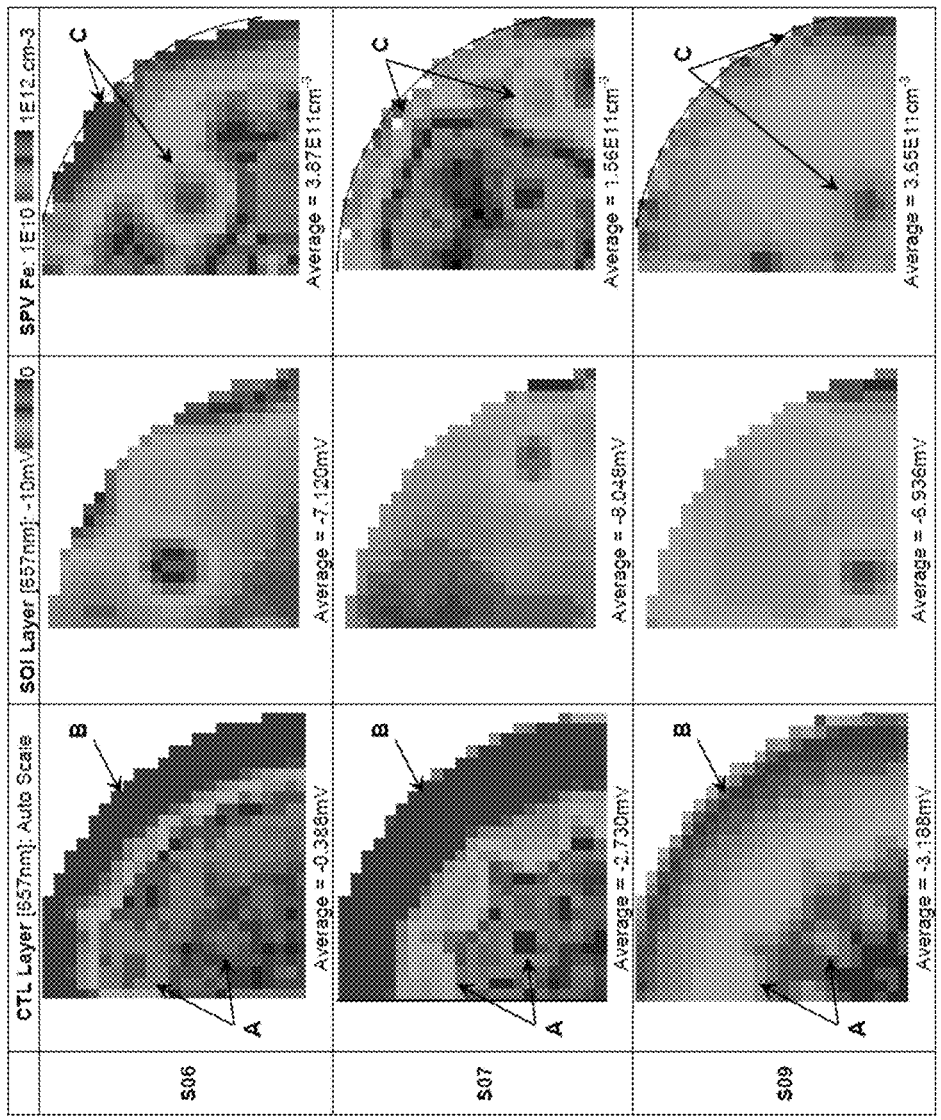
FIG. 7 illustrates SPV Signal maps patterns origin vs. the CVD tool design and vs. the Fe contamination levels.

FIG. 7: SPV Signal maps patterns origin vs. the CVD tool design and vs. the Fe contamination levels. For samples after the polysilicon deposition patterns are ruled by the CVD tool design. For samples with Top-Si ON patterns are ruled by the Fe contamination.

Figure 8:
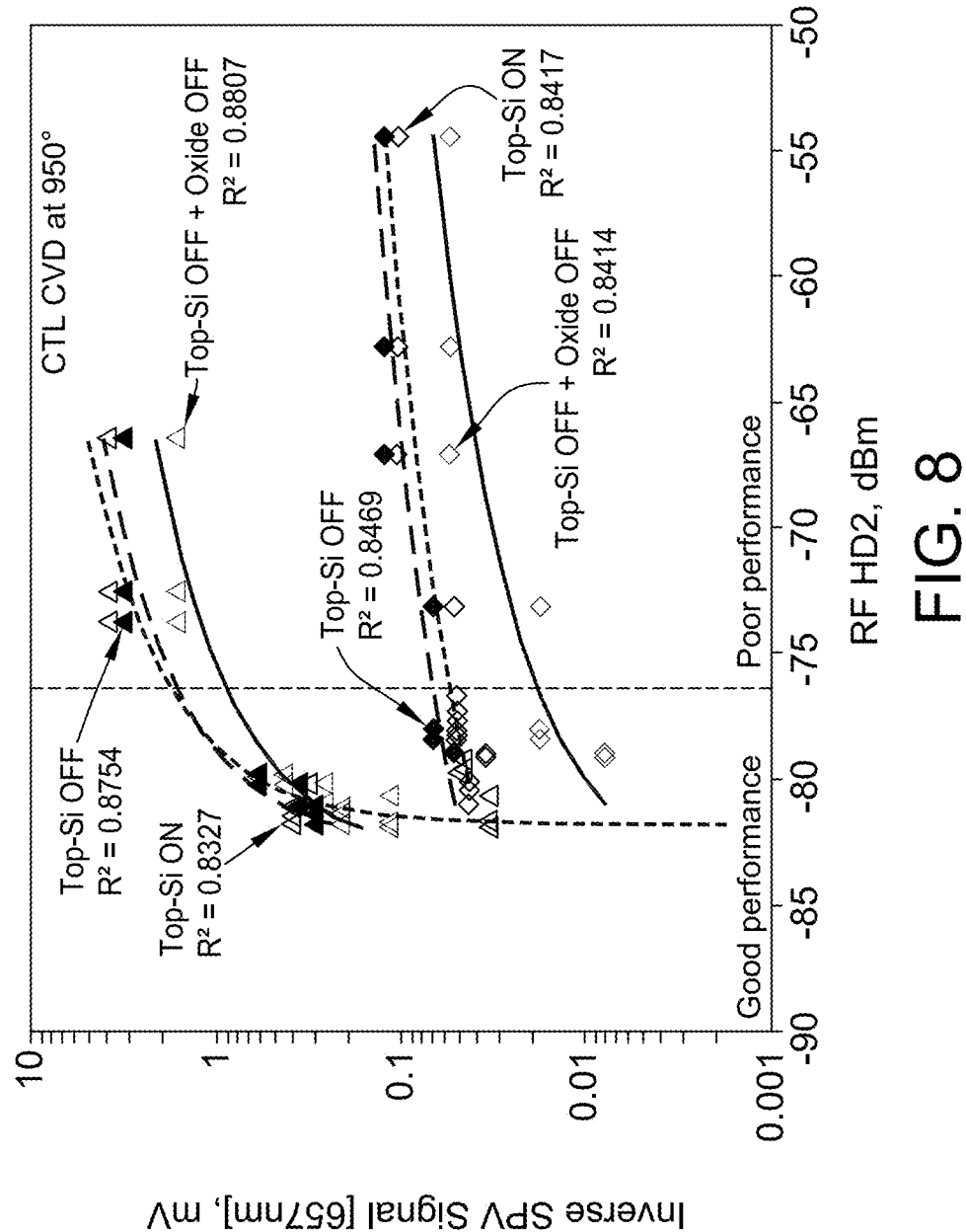
FIG. 8 illustrated the SPV Signal correlation to the RF HD2 evaluation.

FIG. 8: SPV Signal correlation to the RF HD2 evaluation. The results relate to specific CTL SOI samples design and preparation procedures.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for assessing a quality of a semiconductor structure, the semiconductor structure having a front surface and a back surface generally parallel to the front surface and comprising a charge trapping layer, the method comprising:
    illuminating the semiconductor structure to generate charge carriers in the semiconductor structure;
    measuring an electrostatic parameter of the semiconductor structure during or after illumination of the semiconductor structure to generate charge carriers in the semiconductor structure, the electrostatic parameter being selected from the group consisting of (1) a capacitance of the semiconductor structure and (2) a difference in voltage potential between the front surface of the semiconductor structure and an electrode; and
    assessing the charge trapping efficiency of the semiconductor structure to determine suitability of the semiconductor structure for use in a radiofrequency device based on the measured electrostatic parameter of the semiconductor structure.

2. The method as set forth in claim 1 wherein the measured electrostatic parameter is normalized to the measured electrostatic parameter of a semiconductor structure not comprising a charge trapping layer.

3. The method as set forth in claim 1 wherein the measured electrostatic parameter is compared to a baseline parameter to assess the charge trapping efficiency of the semiconductor structure.

4. The method as set forth in claim 1 wherein the electrostatic parameter is the capacitance of the semiconductor structure.

5. The method as set forth in claim 1 wherein the electrostatic parameter is measured during generation of charge carriers.

6. A method for assessing a quality of a plurality of semiconductor structures, the semiconductor structures having a front surface and a back surface generally parallel to the front surface and comprising a charge trapping layer, the method comprising assessing each semiconductor structure by:
    illuminating the semiconductor structure to generate charge carriers in the semiconductor structure;
    measuring an electrostatic parameter of the semiconductor structure during or after illumination of the semiconductor structure to generate charge carriers in the semiconductor structure, the electrostatic parameter being selected from the group consisting of (1) a capacitance of the semiconductor structure and (2) a difference in voltage potential between the front surface of the semiconductor structure and an electrode;
    assessing the charge trapping efficiency of the semiconductor structure based on the measured electrostatic parameter of the semiconductor structure; and
    forming a radiofrequency device only on the semiconductor structures which are determined to be suitable.

7. The method as set forth in claim 6 wherein the semiconductor structure comprises a handle wafer, a dielectric layer, a charge trapping layer disposed between the dielectric layer and the handle wafer, and a silicon device layer, the dielectric layer being disposed between the silicon device layer and the charge trapping layer.

8. The method as set forth in claim 7 wherein the handle wafer has a resistivity of at least about 1,000 Ohm-cm.

9. A method for assessing a quality of a plurality of semiconductor structures, the semiconductor structures having a front surface and a back surface generally parallel to the front surface and comprising a charge trapping layer, the method comprising assessing each semiconductor structure by:
    illuminating the semiconductor structure at fixed injection levels to generate charge carriers in the semiconductor structure; and
    measuring an electrostatic parameter of the semiconductor structure during or after illumination of the semiconductor structure to generate charge carriers in the semiconductor structure, the electrostatic parameter being selected from the group consisting of (1) a capacitance of the semiconductor structure and (2) a difference in voltage potential between the front surface of the semiconductor structure and an electrode; and
    assessing the charge trapping efficiency of the semiconductor structure based on the measured electrostatic parameter of the semiconductor structure.

10. The method as set forth in claim 9 wherein the semiconductor structure comprises a handle wafer having a resistivity of at least about 1,000 Ohm-cm, a dielectric layer, a charge trapping layer disposed between the dielectric layer and the handle wafer, and a silicon device layer, the dielectric layer being disposed between the silicon device layer and the charge trapping layer.

11. A method for assessing a quality of a semiconductor structure, the semiconductor structure having a front surface and a back surface generally parallel to the front surface and comprising a charge trapping layer, the method comprising:
    measuring an initial electrostatic parameter of the semiconductor structure, the initial electrostatic parameter being selected from the group consisting of (1) a capacitance of the semiconductor structure and (2) a difference in voltage potential between the front surface of the semiconductor structure and an electrode;
    generating charge carriers in the semiconductor structure at fixed injection levels; and
    measuring an excited electrostatic parameter of the semiconductor structure during or after generation of charge carriers in the semiconductor structure, the excited electrostatic parameter being the same as the initial electrostatic parameter.

12. The method as set forth in claim 11 comprising determining the difference between the initial electrostatic parameter and the excited electrostatic parameter.

13. The method as set forth in claim 12 wherein the difference is compared to a baseline difference to determine if the semiconductor structure is suitable for use in a radiofrequency device.

14. A method for assessing a quality of a semiconductor structure, the semiconductor structure having a front surface and a back surface generally parallel to the front surface and comprising a charge trapping layer, the method comprising:
    illuminating the semiconductor structure to generate charge carriers in the semiconductor structure;
    measuring an electrostatic parameter of the semiconductor structure during or after illumination of the semiconductor structure to generate charge carriers in the semiconductor structure, the electrostatic parameter being the difference in voltage potential between the front surface of the semiconductor structure and an electrode; and
    assessing the charge trapping efficiency of the semiconductor structure based on the measured electrostatic parameter of the semiconductor structure.

15. A method for assessing a quality of a semiconductor structure, the semiconductor structure having a front surface and a back surface generally parallel to the front surface and comprising a charge trapping layer, the method comprising:
    illuminating the semiconductor structure to generate charge carriers in the semiconductor structure;
    measuring an electrostatic parameter of the semiconductor structure after generation of charge carriers by illumination of the semiconductor structure, the electrostatic parameter being selected from the group consisting of (1) a capacitance of the semiconductor structure and (2) a difference in voltage potential between the front surface of the semiconductor structure and an electrode; and
    assessing the charge trapping efficiency of the semiconductor structure based on the measured electrostatic parameter of the semiconductor structure.

16. A method for assessing a quality of a semiconductor structure, the semiconductor structure having a front surface and a back surface generally parallel to the front surface and comprising a handle wafer having a resistivity of at least about 1,000 Ohm-cm, a dielectric layer, a charge trapping layer disposed between the dielectric layer and the handle wafer, and a silicon device layer, the dielectric layer being disposed between the silicon device layer and the charge trapping layer, the method comprising:
- illuminating the semiconductor structure to generate charge carriers in the semiconductor structure;
- measuring an electrostatic parameter of the semiconductor structure during or after illumination of the semiconductor structure to generate charge carriers in the semiconductor structure, the electrostatic parameter being selected from the group consisting of (1) a capacitance of the semiconductor structure and (2) a difference in voltage potential between the front surface of the semiconductor structure and an electrode; and
- assessing the charge trapping efficiency of the semiconductor structure based on the measured electrostatic parameter of the semiconductor structure.

17. A method for assessing a quality of a semiconductor structure, the semiconductor structure having a front surface and a back surface generally parallel to the front surface and comprising a charge trapping layer, the method comprising:
- illuminating the semiconductor structure by one or more lasers at two different wavelengths to generate charge carriers in the semiconductor structure;
- measuring an electrostatic parameter of the semiconductor structure during or after illumination of the semiconductor structure to generate charge carriers in the semiconductor structure, the electrostatic parameter being selected from the group consisting of (1) a capacitance of the semiconductor structure and (2) a difference in voltage potential between the front surface of the semiconductor structure and an electrode; and
- assessing the charge trapping efficiency of the semiconductor structure based on the measured electrostatic parameter of the semiconductor structure.

18. A method for assessing a quality of a semiconductor structure, the semiconductor structure having a front surface and a back surface generally parallel to the front surface and comprising a charge trapping layer, the method comprising:
- illuminating the semiconductor structure to generate charge carriers in the semiconductor structure;
- measuring an electrostatic parameter of the semiconductor structure during or after illumination of the semiconductor structure to generate charge carriers in the semiconductor structure, the electrostatic parameter being selected from the group consisting of (1) a capacitance of the semiconductor structure and (2) a difference in voltage potential between the front surface of the semiconductor structure and an electrode, wherein the electrostatic parameter is measured at a plurality of sites on the semiconductor structure;
- producing a state map based on the measured electrostatic parameter at each site; and
- assessing the charge trapping efficiency of the semiconductor structure based on the measured electrostatic parameter of the semiconductor structure.

19. The method as set forth in claim 11 comprising assessing the quality of a plurality of semiconductor structures, wherein each semiconductor structure is assessed by:
- measuring an initial electrostatic parameter of the semiconductor structure, the initial electrostatic parameter being selected from the group consisting of (1) a capacitance of the semiconductor structure and (2) a difference in voltage potential between the front surface of the semiconductor structure and an electrode;
- generating charge carriers in the semiconductor structure;
- measuring an excited electrostatic parameter of the semiconductor structure during or after generation of charge carriers in the semiconductor structure, the excited electrostatic parameter being the same as the initial electrostatic parameter;
- determining the difference between the initial electrostatic parameter and the excited electrostatic parameter;
- comparing the difference between the initial electrostatic parameter and the excited electrostatic parameter for each semiconductor structure to a baseline difference to assess the semiconductor structure; and
- forming a radiofrequency device only on semiconductor structures which are determined to be suitable.

20. A method for assessing a quality of a semiconductor structure, the semiconductor structure having a front surface and a back surface generally parallel to the front surface and comprising a charge trapping layer, the method comprising:
- measuring an initial electrostatic parameter of the semiconductor structure, the initial electrostatic parameter being selected from the group consisting of (1) a capacitance of the semiconductor structure and (2) a difference in voltage potential between the front surface of the semiconductor structure and an electrode;
- generating charge carriers in the semiconductor structure by illuminating the semiconductor structure at two different wavelengths by one or more lasers; and
- measuring an excited electrostatic parameter of the semiconductor structure during or after generation of charge carriers in the semiconductor structure, the excited electrostatic parameter being the same as the initial electrostatic parameter.

* * * * *